(12) United States Patent
Hofmeister

(10) Patent No.: US 7,192,791 B2
(45) Date of Patent: Mar. 20, 2007

(54) SEMICONDUCTOR WAFER HAVING AN EDGE BASED IDENTIFICATION FEATURE

(75) Inventor: Christopher A. Hofmeister, Hampstead, NH (US)

(73) Assignee: Brooks Automation, Inc., Chelmsford, MA (US)

(*) Notice: Subject to any disclaimer, the term of this patent is extended or adjusted under 35 U.S.C. 154(b) by 0 days.

(21) Appl. No.: 10/465,677

(22) Filed: Jun. 19, 2003

(65) Prior Publication Data

US 2004/0259277 A1     Dec. 23, 2004

(51) Int. Cl.
*H01L 21/66* (2006.01)
*H01L 29/06* (2006.01)

(52) U.S. Cl. .................. 438/14; 438/16; 438/401; 257/618; 257/620

(58) Field of Classification Search .............. 438/800, 438/940, 16, 974, 14, 401, 975; 257/618, 257/620

See application file for complete search history.

(56) References Cited

U.S. PATENT DOCUMENTS

| 4,418,467 | A | * | 12/1983 | Iwai ............................ 148/33 |
| 6,004,405 | A | * | 12/1999 | Oishi et al. ................. 148/33.2 |
| 6,071,059 | A | | 6/2000 | Mages et al. ................ 414/411 |
| 6,268,641 | B1 | | 7/2001 | Yano et al. .................. 257/620 |
| 6,420,792 | B1 | * | 7/2002 | Guldi et al. ................. 257/797 |
| 6,482,661 | B1 | * | 11/2002 | Madoyski .................... 438/14 |
| 6,666,337 | B1 | * | 12/2003 | Conboy et al. ............. 209/546 |

* cited by examiner

*Primary Examiner*—Kevin M. Picardat
(74) *Attorney, Agent, or Firm*—Perman & Green, LLP; Richard Pickreign

(57) ABSTRACT

A semiconductor wafer comprises a wafer formed of a semiconductor material having a peripheral edge portion and a repeating mark on the edge portion of the wafer to allow identification of the wafer. Also described is a method of identifying and tracking these semiconductor wafers.

16 Claims, 5 Drawing Sheets

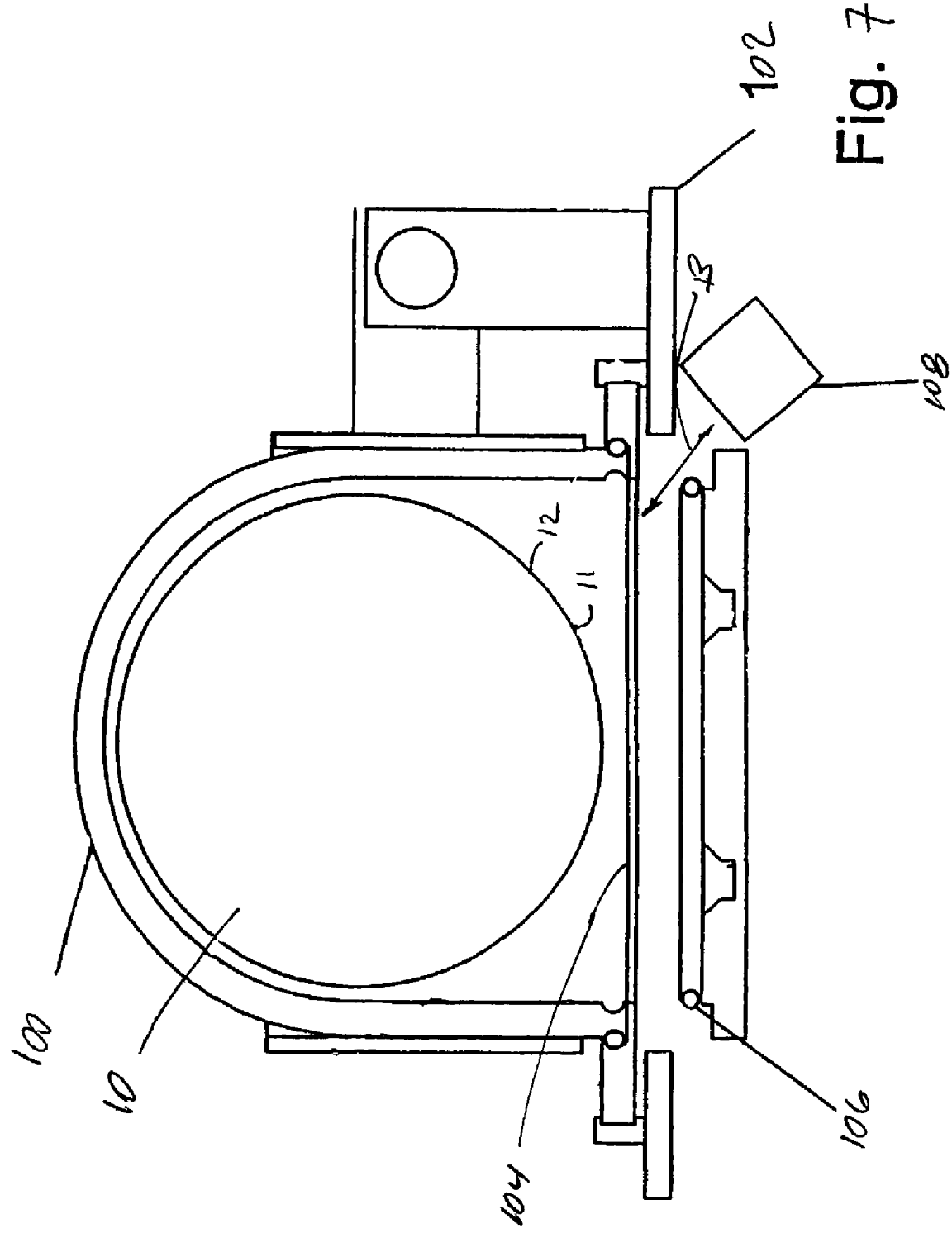

SEMICONDUCTOR WAFER HAVING AN EDGE BASED IDENTIFICATION FEATURE

BACKGROUND OF THE INVENTION

1. Field of the Invention

The present invention relates to a system for the identification of semiconductors, and more particularly to semiconductor wafers, such as silicon wafers, having identification markings thereon which enable the positive identification of a batch of such wafers irrespective of how the wafer is positioned for reading the markings along, with a method of reading such markings on the wafers.

2. Description of Prior Developments

Basically, known or conventional character based or pattern based identification marks or scribes on semiconductor wafers for being able to identify the wafers during integrated circuit fabrication are located on a surface of the wafer in a single position. For example, it is known to mark a semiconductor wafer, such as a silicon wafer, early on in the integrated circuit fabrication process with an identifying number for identifying the wafer during subsequent processing. This identifying number typically consists of an ordered series of digits that indicate, for example, a fabrication number, lot number, wafer number, etc. The wafers typically are tracked on a computer system to control inventory or to select or control one or more processing steps depending upon the identity of a particular wafer. Prior to reading the markings or identification marks on the wafers, each or all of the wafers must be aligned so as to enable a correct reading of the characters on the wafer. The process of needing to align each and/or all of the wafers before the reading of the characters takes time and increases the overall cost of the process. Thus, it is desired to avoid various process steps for reading these wafers as described in U.S. Pat. Nos. 5,917,169 and 5,870,488.

In addition to their use in processing tools for forming integrated circuits on semiconductor wafers, workpiece handling robots are used in stand alone processing tools such as for example wafer sorters. Wafer sorters are used for a variety of purposes in a fab, such as for example to transfer one or more wafers between various cassettes positioned on the wafer sorter. During this process, wafers from a number of cassettes can be combined into one cassette, and wafers from one cassette can alternatively be split up among a number of cassettes. The wafers can also be transferred between the cassettes in the same order or reordered as desired. Another function of a wafer sorter is to map the location of wafers within a cassette, and to detect incorrect positioning of wafers within a cassette.

A wafer sorter may further include an aligner. Conventional aligners have a chuck for supporting and rotating a wafer and typically two cameras, one for identifying a radial runout (i.e., a magnitude and direction by which the workpiece deviates from an expected centered position on the chuck), and for identifying the position of a notch located along the circumference of the wafer. An aligner typically includes a second camera for reading an optical character recognition (OCR) mark which identifies the workpiece. In a conventional wafer sorter, wafers are transferred one at a time to the chuck of the aligner which then rotates the wafer to determine the radial runout, identify the location of the notch, and to read the OCR mark. The wafers are then returned one at a time to the wafer cassette. Conventional aligner/robot systems which transfer workpieces one at a time between the workpiece cassette and aligner have a relatively low throughput, on the order of approximately 200–250 wafers processing per hour. This low throughput is significant as the alignment process must be performed for each processing station where an indicial mark reading is required, and must be performed on each individual wafer at each of these stations. All of the time spent and equipment needed for wafer alignment is avoided by employing the features of the present invention.

One known process for placing marks on semiconductor wafers for identification purposes involves the use of a laser scribe system. In such a system a laser places marks on a semiconductor wafer in a predetermined pattern to form a series of marks, such as for example, a series of numbers on the wafers. Basically the process involves the use of a laser beam to melt and vaporize the wafer material, e.g. the silicon, to form a mark or depression at a predetermined position on the semiconductor wafer. Various kinds of characters, such as alphanumeric characters, can be formed by the laser. An optical type system can be used with the type of laser system described above to permit a computer system to read a wafer identifying mark. Such an optical system basically includes an optical input device coupled to a light receiver and then a computer for processing the data. Although the laser written characters can be read under good conditions of light, the use of these characters on silicon wafers present certain disadvantages since they are generally difficult to read because the contrast between the character and the silicon wafer is very limited. Add to these disadvantages the requirement that the wafers need to be aligned for a correct reading of the markings and the chances of not being able to obtain a correct reading of the characters is increased.

SUMMARY OF THE INVENTION

The above described disadvantages illustrated by the prior art systems for semiconductor wafer identification are eliminated in accordance with the features of the present invention. In one embodiment for example, a repeating identification mark is marked, etched, or otherwise formed on the surface or peripheral edge of a semiconductor wafer. Such mark could, for example be, a repeating bar code pattern. Therefore, one embodiment of the present invention is directed to a semiconductor wafer comprising a wafer formed of a semiconductor material having a peripheral edge portion and a repeating mark on the edge portion of the wafer to allow identification of the wafer.

In accordance with further embodiments of the present invention there is defined a method of identifying and tracking semiconductor wafers comprising the steps of inscribing a repeating pattern of marks on the peripheral edge portion of each of a plurality of semiconductor wafers; loading a plurality of the individual wafers into a container in the form of a front opening unified pod; and scanning the marks on the wafers with a reader capable of reading the information from the marks positioned on the edge of the wafers.

A typical semiconductor wafer sorter sequence may involve, for example, verifying the identification of each semiconductor wafer, and then sorting the wafers in ascending or descending order. In this case, the complete handling sequence for identification must be accomplished before the sorting sequence may be started. In accordance with the features of the present invention, the cassette (or foup, i.e. the container within which the wafers are stacked during processing and during the character reading process) may be scanned quickly with the door on the foup (if clear so as to enable the correct reading of the characters on the wafers) or off if the door is not clear, and the first identification handling sequence skipped altogether.

The features in accordance with the present invention can be implemented in, for example, a stand alone verification station, a stack of foups, or any other application where the identification of the wafer needs to be determined before or after a step or process or sequence.

BRIEF DESCRIPTION OF THE DRAWINGS

The accompanying drawings which constitute a part of the specification, illustrate embodiments of the present invention, and together with the general description above and the detailed description of the preferred embodiments given below, serve to explain the principles of the invention.

FIG. 7 is a schematic plan view of a wafer processing apparatus and FOUP with a wafer as shown in FIG. 1 in the FOUP.

DETAILED DESCRIPTION OF THE PREFERRED EMBODIMENTS

Figure 1:
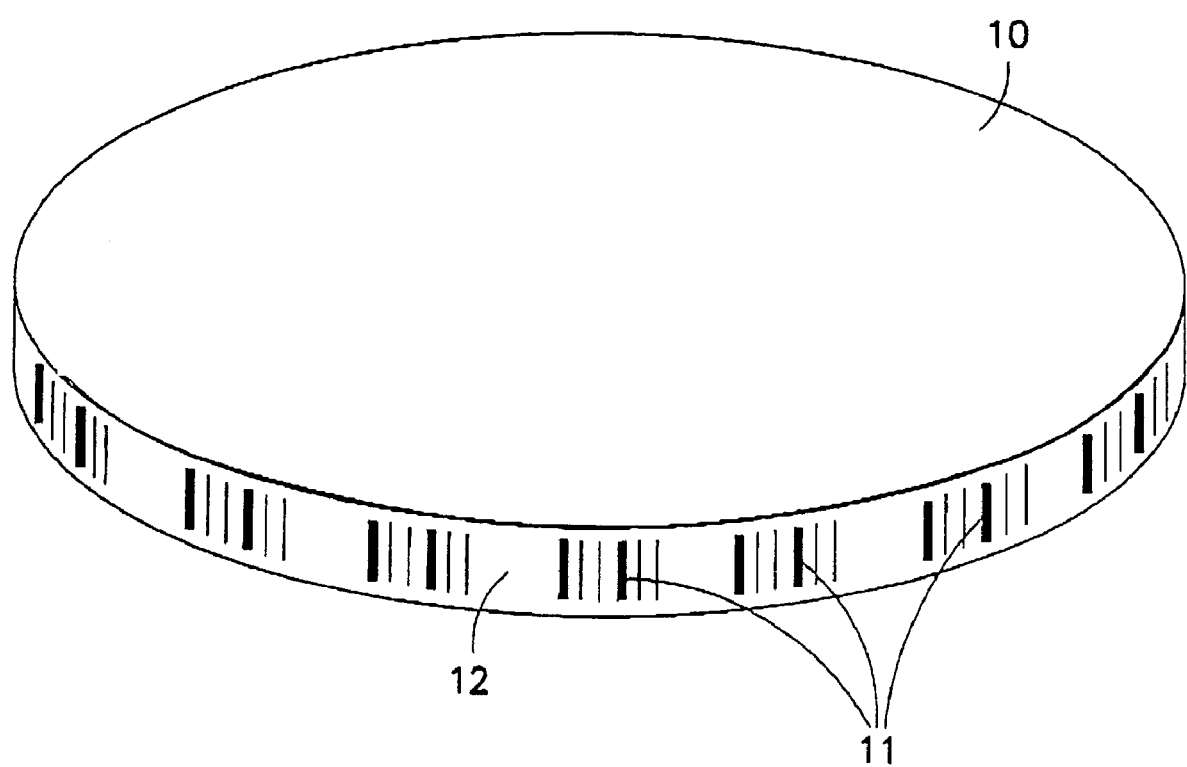
FIG. 1 is a plan view of an embodiment of a semiconductor wafer illustrating a repeating identification mark in the form of a bar code along the peripheral edge of the wafer.

FIG. 1, illustrates an embodiment of a semiconductor wafer 10 formed of a semiconductor material with a repeating mark 11 in the form of a bar code throughout the edge portion 12 of the wafer. The wafer 10 is applied with an independent identification indication or mark 11 for identifying the semiconductor wafer 12 before the semiconductor circuit forming treatment. The identification mark 11 in the form of, for example, the bar code as illustrated can be formed by engraving the semiconductor wafer 10 by laser beam radiation so as to recognize the outline of an engraving in the form of a repeating identification mark along the peripheral edge portion of the wafer. Although the embodiments of this invention are described below with particular reference to a semiconductor wafer, the present invention is equally applicable to any suitable material panel such as for example flat panel displays.

The mark, etch or scribe in the form of repeating identification mark on the peripheral edge of wafer 10 can, for example, be a repeating bar code pattern with a check-sum at repeating intervals or standard spacing and/or a start/end pattern. This allows scanning of the wafers while still in the FOUP (i.e. front opening unified pod) with conventional bar code pattern technology and software adapted to identify the start/stop of the pattern. In alternate embodiments, optical characters, one-dimensional or two-dimensional optical patterns may be provided and readable by CCD cameras or other optical means.

The identification mark 11 can also include a combination of bar codes appropriate for reading optically and numerals and/or letters appropriate for reading visibly. Unlike much of the conventional technology, the indication or mark is not formed on the front surface or the rear surface or on a selected side surface of the semiconductor wafer 10 but on the peripheral edge portion 12 portion of semiconducting wafer 10 by a repeating mark 5 placed on the wafer by an engraving process, for example, laser beam radiation. In alternate embodiments, a repeating pattern may be provided on the surface of the wafer. Various treatment processes are conducted for forming the semiconductor circuit in each chip area on the surface of the semiconductor wafer 10 with the identification mark 11 formed thereon. The treatment processes include abrading or flattening processes such as an oxide film formation process, a metal film formation process, a heating process, a resist application process, a piercing process, a lithography process, an ion injection process, a CMP, etc. In the case where the identification mark 11 defined by the engraving is formed on the surface of the semiconductor wafer 10 in the conventional way, the outline of the identification mark 11, that is, the engraving disappears or becomes unclear by the treatment processes so that it cannot be recognized unless it is shielded from the effect of the process. Moreover, a wrapping treatment is applied on the semiconductor wafer 10 from the rear surface preceding the packaging.

However, in this embodiment, the identification mark 11 is formed on the peripheral edge portion 12 of the semiconductor wafer 10 with a repeating mark 11. In alternate embodiments, the identification mark or markings may be formed on any suitable portion of the front or rear surfaces of the wafer such as a peripheral region of the front or rear surfaces, or possibly a peripheral chamfered surface of the wafer. In this embodiment, the identification mark 11 is formed in a repeated pattern along the edge portion 12 (i.e. circumference of wafer 10). Since the identification mark 11 is formed repeatedly on the edge surface 12 of the semiconductor wafer 10, even if various treatment processes are repeatedly conducted for forming a semiconductor circuit in each chip area on the wafer 10 surface as in the conventional technology, the identification mark 11 that is, the engraving cannot disappear or become unclear by the treatment processes. Accordingly, since the identification is formed on the edge surface 12 of the semiconductor wafer 10 in a repeating pattern but not on the treated surfaces of the semiconductor wafer 10, the repeated mark 11 formed on the edge surface 12 of the semiconductor wafer 10 cannot disappear or become unclear. The mark 11 can be maintained so as to be recognizable clearly even if various treatment processes are repeatedly conducted for forming a semiconductor circuit in each chip area on the wafer 10 surface as in the conventional technology, or by the wrapping treatment on the rear surface of the semiconductor wafer 10. Accordingly, the identification mark 11 by engraving can be maintained to be recognized sufficiently clearly until the process where the wafer 10 is cut into chips is completed. The identification mark 11 may be engraved by a laser beam radiation as done by conventional laser beam radiation technology, though any other suitable formation process may be used.

The wafer can include in addition to a repeated pattern of identification marks throughout the entire peripheral edge portion of the wafer, an orienteering notch or flat portion (not shown) along with the repeating marks. The orienteering notch or flat portion may be used for orienting the wafer during processing. If desired, the repeating marks may be formed on a portion of the wafer excluding the part where the orientating notch, to be engaged with a hook of a wafer stage of a stepper device, is formed. In alternate embodiments, the pattern may overlap the notch or flat.

Figure 4:
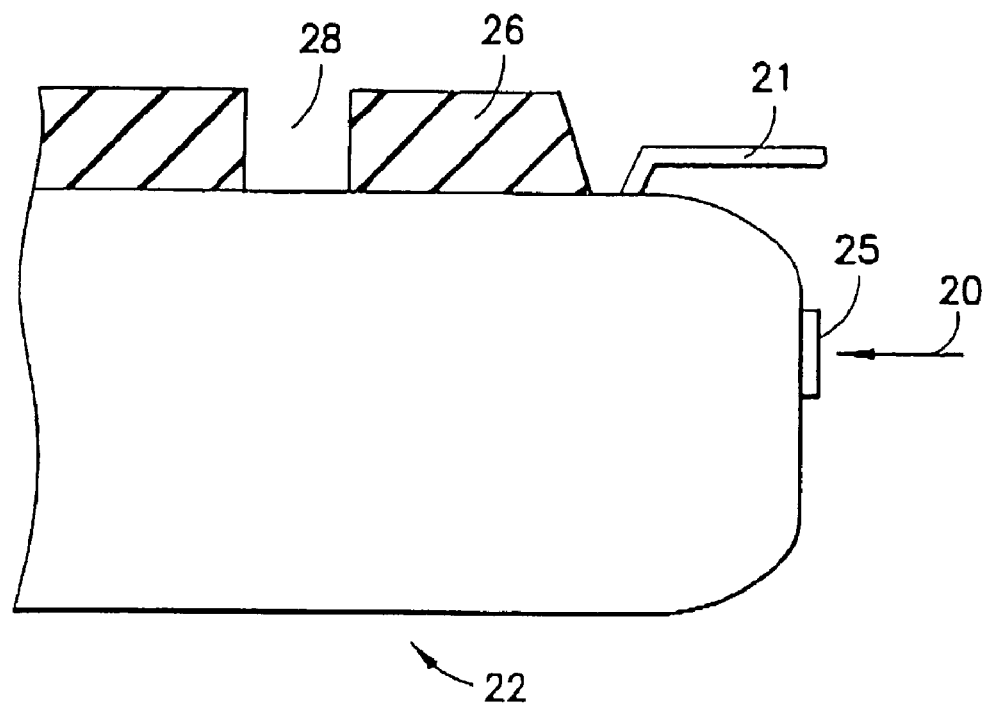
FIG. 4 is another cross-sectional view of a semiconductor wafer during the treatment process for forming a semiconductor circuit with the wafer having repeated marks on the peripheral edge of the wafer.

An example of a loading and unloading station which processes semiconductor wafers that can incorporate the features of the present invention is described in U.S. Pat. No. 6,071,059, issued Jun. 6, 2000 to Mages et al, the features of which are incorporated herein by reference. As shown in FIG. 4 of the patent there is shown a FOUP type container identified as a transporting container 24 (i.e., a front opening unified pod) that can be open or closed. Whether the pod is open or covered, it can include a plurality of semiconductor wafers with repeated marks positioned according to the manner described before which can be scanned and read by a reading device as shown in FIG. 7 and as will be described below in greater detail.

In FIGS. 2 to 6 there is illustrated a suitable process of forming a semiconductor circuit employing a semiconductor wafer 22 incorporating the features of the present invention along with an example of a treatment process of forming electrode wiring via a contact hole in a semiconductor wafer with the identification marks being placed on the wafer in a repeating pattern throughout the entire peripheral edge portion of the wafer.

Figure 2:
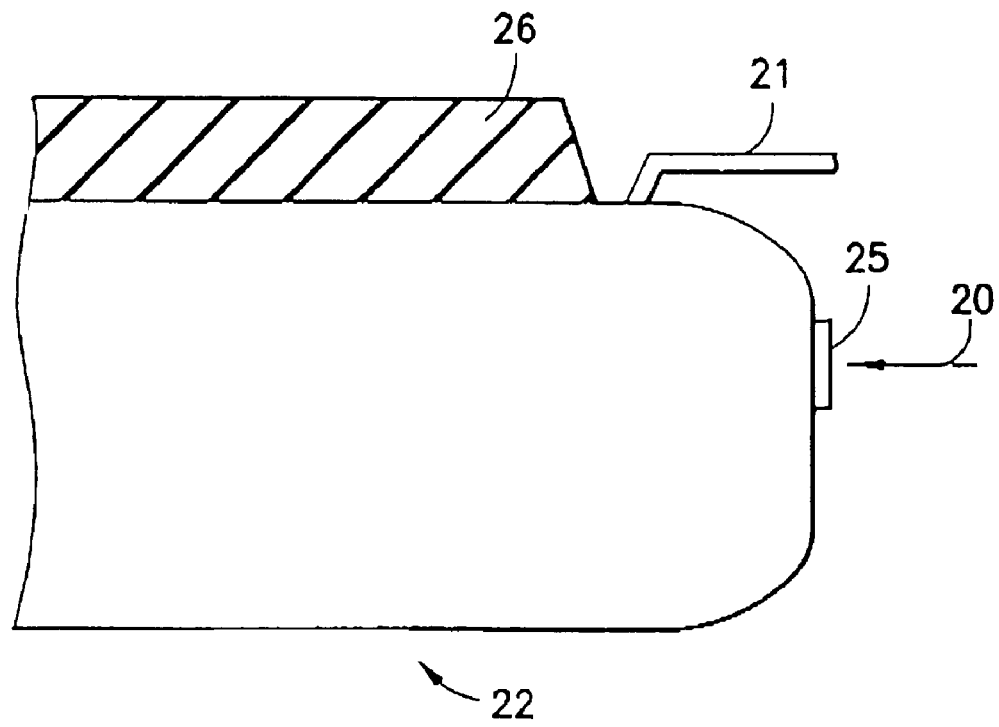
FIG. 2 is a cross-sectional view of a semiconductor wafer during the treatment process for forming a semiconductor circuit with the wafer having repeated marks throughout the peripheral edge of the wafer.
Figure 3:
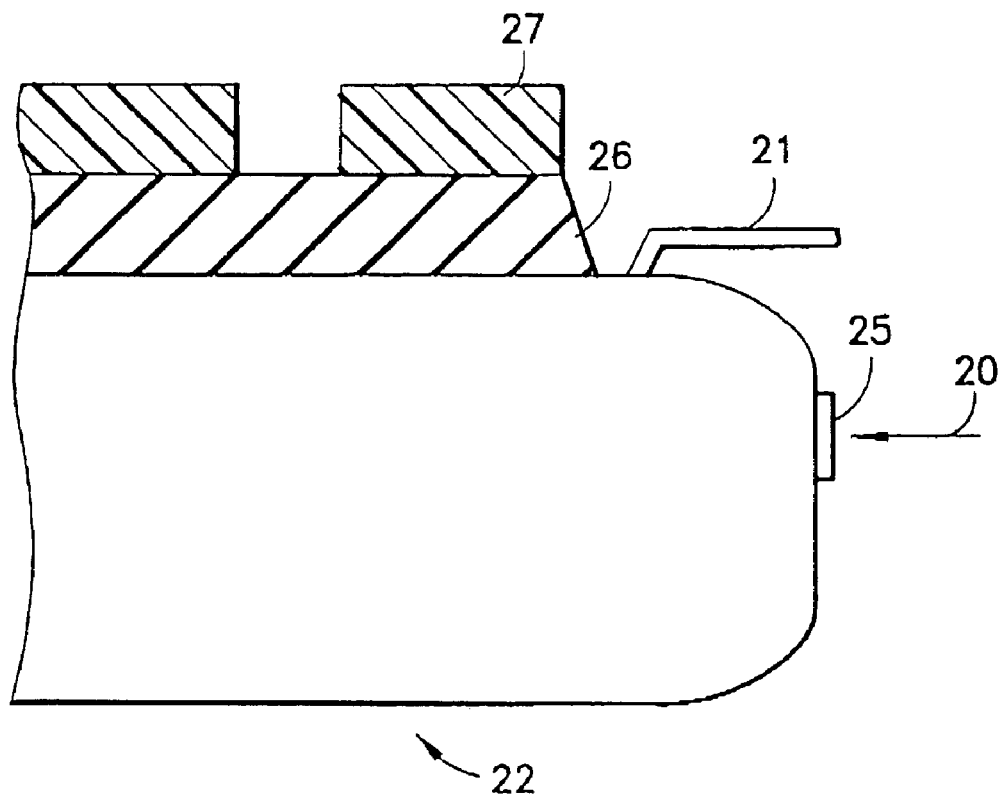
FIG. 3 is another cross-sectional view of a semiconductor wafer during the treatment process for forming a semiconductor circuit with the wafer having repeated marks on the peripheral edge of the wafer.
Figure 5:
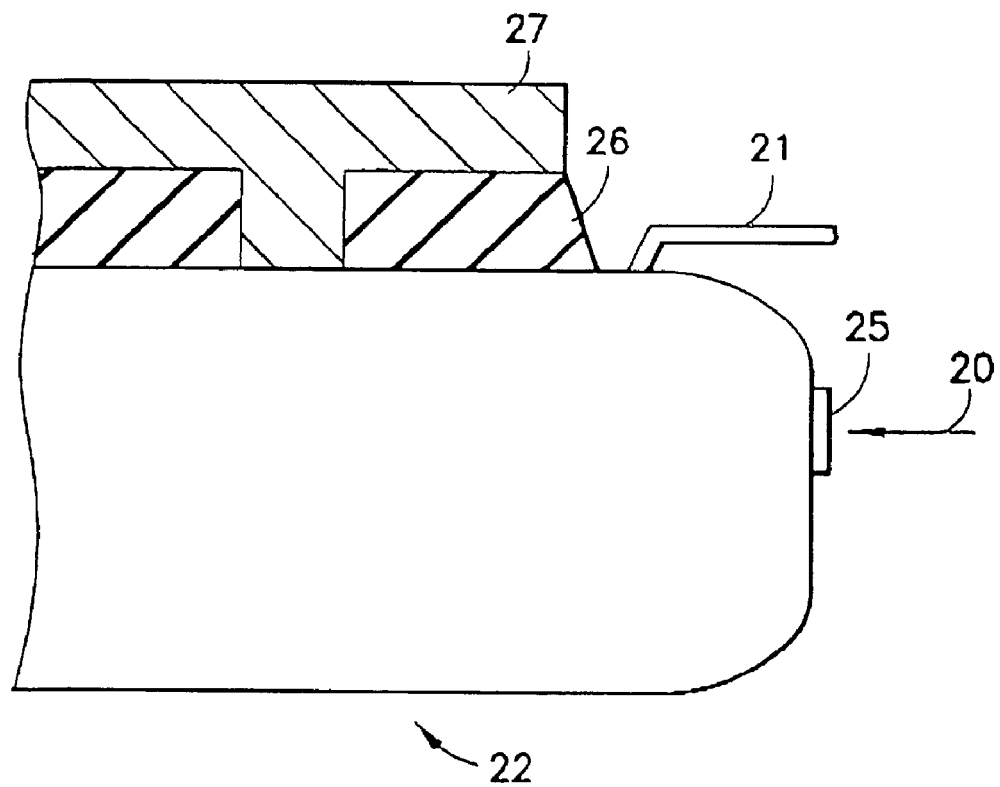
FIG. 5 is still another cross-sectional view of a semiconductor wafer during the treatment process for forming a semiconductor circuit with the wafer having repeated marks on the peripheral edge of the wafer.
Figure 6:
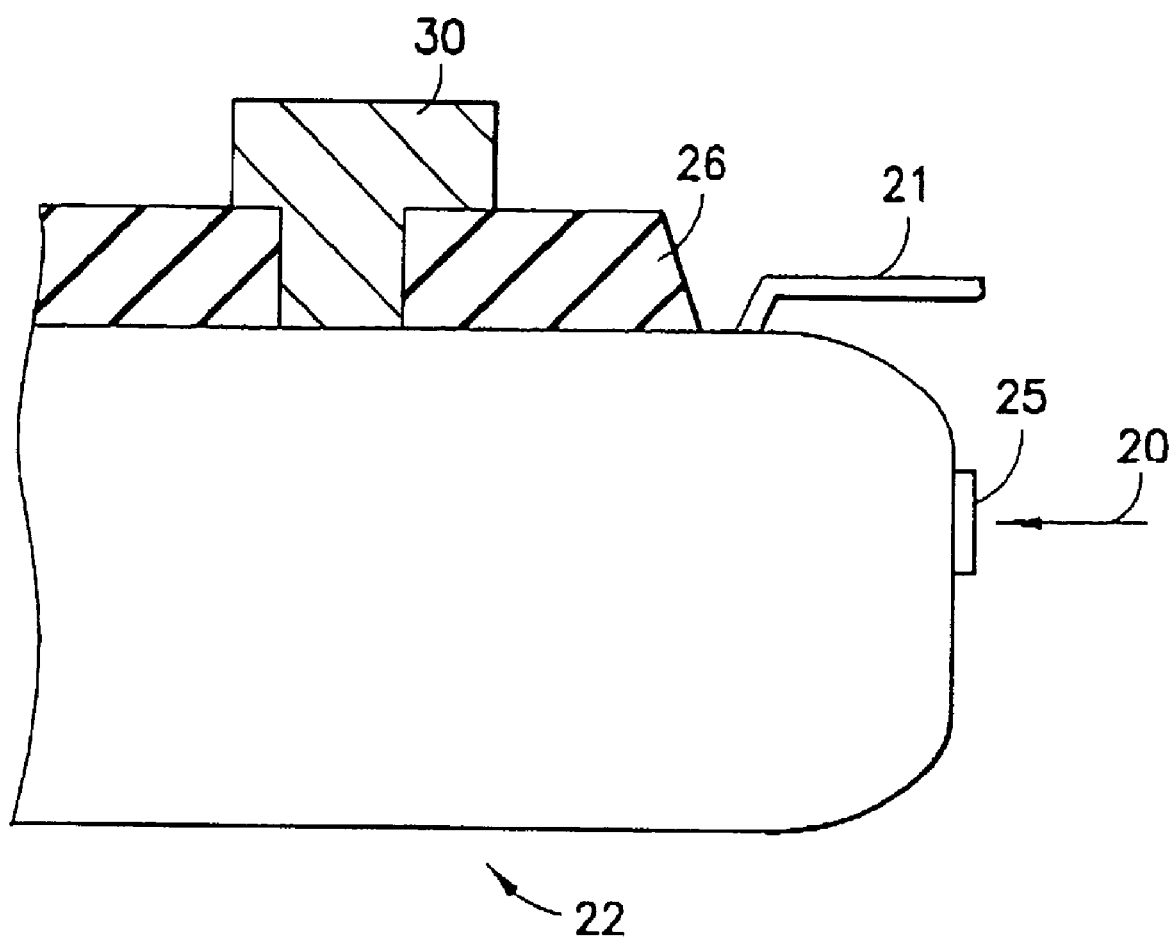
FIG. 6 is yet another cross-sectional view of a semiconductor wafer during the treatment process for forming a semiconductor circuit with the wafer having repeated marks on the peripheral edge of the wafer.

As shown in FIG. 2, repeat marks 25 are formed on the peripheral portion of the semiconductor wafer 22 by engraving by, for example, laser light radiation by a laser beam 20. Preceding the semiconductor circuit formation, the semiconductor wafer portion where the identification marks are formed is covered with a cover member 21 provided in a wafer supporting device (not illustrated). This is to avoid the risk of, for example, having the marks 25 placed on the wafer 22 becoming unclear by the effect of adhesion of the layer material in the treatment process of forming the semiconductor circuit. Then, an insulating film 26 is formed on the entire surface of semiconductor wafer 22 by a heat oxidation treatment, i.e., CVD treatment. A resist is applied on the entire surface of the insulating film. By patterning the formed resist layer, a resist pattern 27 is formed as shown in FIG. 3. By using the resist pattern as a mask, a contact hole 28 is formed on insulating film as shown in FIG. 4. By forming a metal film, such as an Al film 29 on the entire surface of the wafer including the insulating film 26 by the CVD method, and patterning the metal film, an electrode wiring 30 connected with the semiconductor wafer can be formed via the contact hole 28 as shown in FIG. 5. The treatment processes may be applied on the front surface of the semiconductor wafer 22. Since the identification marks 25 are formed in this embodiment on the peripheral portion of the semiconductor wafer 22, the identification mark hardly suffers the effect of the treatment processes. Therefore, the identification marks can be clearly recognized in the treatment processes. Besides, since the semiconductor wafer portion where the identification marks are formed is covered with cover member 21, the effect of the treatment processes on the identification marks can be further reduced. In the treatment, examination is conducted after each process on whether the treatment was conducted normally or a defect was generated. In this case, semiconductor wafer 22 with a defect or the treatment process where the defect is generated can be detected with a high accuracy. After forming the electrode wiring 30 (See FIG. 6) by patterning the metal film 29 (See FIG. 5), an examination is conducted on whether the electrode wiring 30 is normally formed or a defect is generated so that in which semiconductor wafer 22 and in which treatment process that any defect is generated can be detected. Since a semiconductor wafer where a defect is generated and a treatment process where the defect is generated can be detected after each treatment process, modification of the defect can be enabled or implementation of a meaningless treatment process after detecting the defect or a meaningless final examination can be avoided. The semiconductor wafer 22 treated as heretofore mentioned is applied with a further treatment process for forming a semiconductor circuit. After completing the semiconductor circuit, the semiconductor wafer 22 is cut and separated into chips. In this embodiment, since the repeated identification marks are formed on the peripheral portion of the semiconductor wafer 22 in the treatment process for completing the semiconductor circuit, the identification marks can still be readily read in the cutting and separating process.

The repeated identification marks can be, for example, a bar code or numerals or letters as a combination of numerals and letters, i.e. alphanumeric symbols. Examples include 2D bar codes, codes such as EAN-UPC, ITF, CODE 39, CODA-BAR and CODE 128.

FIG. 7 shows a schematic plan view of a wafer storage or transport container, such as a FOUP 100, positioned on a wafer processing apparatus 102 (only a portion of the apparatus is shown). The FOUP 100 may hold one or more wafers 10 (in FIG. 7 only the top most wafer is visible). As seen in FIG. 7, the FOUP 100 is positioned on processing apparatus 102 so that the opening 104 in the FOUP faces the aperture of the processing apparatus. The FOUP door 100 may be removed by any suitable means and positioned as desired. As seen in FIG. 7, the apparatus 102 may be provided with a sensor or reader 108 capable of detecting the wafer(s) 10 in the FOUP 100 when the door 106 is removed. For example, the sensor 108 may be an electro-optical sensor, such as a laser, capable of directing a beam of electromagnetic radiation (indicated by arrow B in FIG. 7) at the region 12 of the wafer 10 having marks 11 thereon. The sensor 108 may be able to detect the region by sensing a reflected beam from the wafer for example. The sensor 108 depicted schematically in FIG. 7, may further be able to scan the region to read the pattern of mark 11 thereby reading the identification information embodied therein. The repeated pattern of mark 11 around the peripheral region of the wafer(s) 10 ensures that at least one pattern (or such portions as to form one pattern) of mark 11 faces the sensor 108 and may thus be read by the sensor. It is noted that the start/end patterns or check-sum included in the repeating pattern allows the sensor to obtain the complete identification information by reading those portions of the pattern in the field of view of the sensor 108, in those cases where the wafer position does not result in a complete pattern being within the field of view of the sensor. Accordingly, the wafer(s) 10 may be placed in the FOUP in any desirable orientation and still allow sensor 108 to read the identification marks 11 on each wafer.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method of identifying and tracking semiconductor wafers comprising:
   inscribing a repeating pattern of marks on the peripheral edge portion of each of a plurality of semiconductor wafers, each repetition of the pattern of marks on each wafer embodying predetermined information identifying the wafer;
   loading a plurality of the inscribed wafers into a container in the form of a front opening unified pod; and
   scanning the marks on the wafers with a reader capable of reading the information from the marks on the wafers where in the repeating pattern of marks is disposed on the peripheral edge so that identification of the wafer is determinable from any portion of the peripheral edge substantially no longer than a length of but one repetition of the pattern of marks.

2. An identification method according to claim 1 wherein said marks are bar codes and said reader is a bar code reader.

3. An identification method according to claim 2 wherein said bar code is a 2-D barcode.

4. An identification method according to claim 1 wherein said marks are alphanumeric symbols.

5. An identification method according to claim 1 further comprising providing said pod with an opaque door covering said front opening.

6. A semiconductor wafer comprising a wafer formed of a semiconductor material, the wafer having a peripheral edge portion and repeating marks throughout the edge portion of the wafer, each mark having a predetermined pattern adapted to allow identification of the wafer, wherein the repeating predetermined pattern of the repeating marks is disposed on the edge portion so that identification of the wafer, from the predetermined pattern, is determinable from scanning any portion of the periphery substantially no longer than a length of but one of the predetermined pattern.

7. A semiconductor wafer according to claim 6, wherein said marks are bar codes capable of being read optically.

8. A semiconductor wafer according to claim 7, wherein said bar code is a 2-D bar code.

9. A semiconductor wafer according to claim 6, wherein said marks are alphanumeric codes capable of being read visibly.

10. A semiconductor wafer according to claim 6, wherein said marks are a combination of bar codes and alphanumeric symbols.

11. The semiconductor wafer according to claim 6, wherein the identification mark includes a visibly recognizable indication.

12. The semiconductor wafer according to claim 11, wherein the identification mark includes a numeral and/or a mark.

13. The semiconductor wafer according to claim 6, wherein the identification mark includes an optically recognizable mark.

14. The semiconductor wafer according to claim 13, wherein the optically recognizable mark includes a bar code.

15. The semiconductor wafer according to claim 6, wherein the identification mark includes identification mark recognizable by a laser beam.

16. The semiconductor wafer according to claim 15, wherein the identification mark recognizable by a laser beam includes a bar code.

* * * * *